United States Patent [19]

Glazebrook

[11] Patent Number: 4,965,854
[45] Date of Patent: Oct. 23, 1990

[54] NOISE BLANKER WITH CONTINUOUS WAVE INTERFERENCE COMPENSATION

[75] Inventor: Ellis Glazebrook, Lynchburg, Va.

[73] Assignee: General Electric Company, Lynchburg, Va.

[21] Appl. No.: 277,813

[22] Filed: Nov. 30, 1988

[51] Int. Cl.$^5$ .............................................. H04B 1/10
[52] U.S. Cl. .................................... 455/224; 375/104; 455/295
[58] Field of Search ...................... 455/223, 224, 295; 375/104

[56] References Cited

U.S. PATENT DOCUMENTS

| | | | |
|---|---|---|---|
| 4,203,072 | 3/1980 | Beningfield et al. | 455/223 |
| 4,327,446 | 4/1982 | Dressler | 455/223 |
| 4,479,251 | 10/1984 | Dawson | 455/223 |
| 4,688,256 | 8/1987 | Chemelewski | 455/223 |

Primary Examiner—Ernest F. Karlsen
Assistant Examiner—Lisa Charouel
Attorney, Agent, or Firm—Nixon & Vanderhye

[57] ABSTRACT

A noise blanker is disclosed which blanks out impulse noise emanating from the alternator, ignition systems of rotor vehicles, and other sources. This is accomplished by delaying an input IF signal while generating a blanking gate pulse occurring at the same time as the noise pulses. These blanking pulses are then used in turn off the delayed IF signal precisely where the noise occurs, resulting in noise-free audio reception. The noise blanker operates to detect noise pulses by detecting the leading edge of any narrow pulse which is received at the front end of the receiver and is reflected in the IF input signal. At the same time, by virtue of the operation of an AGC amplifier the noise blanker's vulnerability to interference or capture by continuous-wave signals is reduced.

16 Claims, 4 Drawing Sheets

FET GATES

NOISE BLANKER WITH CONTINUOUS WAVE INTERFERENCE COMPENSATION

FIELD OF THE INVENTION

This invention relates generally to noise blanking circuitry for use in a radio frequency (RF) communications device. More particularly, the invention relates to noise blanker circuitry which includes automatic gain control circuitry to reduce its vulnerability to capture by continuous wave (CW) or CW-like signals.

BACKGROUND AND SUMMARY OF THE INVENTION

Mobile and portable radio frequency transceivers and other communications devices have heretofore incorporated noise blanker circuitry which detect impulse noise signals that have sufficient peak power to interfere with an FM receiver listening to weak signals. The function of such noise blankers is to eliminate ignition or other vehicle-generated noise which might interfere with radio reception. Such impulse noise may emanate from the vehicle tires, the alternator, the ignition system, etc.

A noise blanker also must be designed to eliminate noise signals received from other sources of interference external to a radio installed in a motor vehicle. For example, interfering noise signals may be generated by electrical arc-welding equipment or any other source which radiates intense, narrow signals in the RF region.

Impulse noise from any of such sources is typified by high peak power, but very low average power. This is because the energy occurs in very short bursts, 10-20 nanoseconds in extent, spaced relatively far apart.

Interference from continuous-wave (CW) signal sources, such as pagers or broadcast television, can serve to block the proper operation of noise-blanker circuitry. In this regard, noise blankers are typically designed to detect and cancel impulse noise signals which would otherwise interfere with the reception of weak FM signals. For modern lowband (30 to 50 MHz) land-mobile receivers, this means that the detection threshold of the noise blanker should be at a low level. With the detection limit set low, the noise blanker is subject to capture by continuous- wave signals or other high-duty-cycle signals which occur in the sampling band, when their signal strength is equal to or greater than the noise detection threshold.

As noted above, such continuous-wave signals can interfere with the proper functioning of the noise blanker circuitry. The strength of these CW signals is not enough to trigger the operation of the noise-eliminating circuitry within the noise blanker. However, the CW signal interferes with the proper gating in the noise blanker which ultimately results in noise heard by a radio listener.

The noise-blanker circuitry in performing its function of eliminating impulse noise must respond to a broad frequency band. Accordingly, even if the continuous-wave signal is outside the bandwidth of the receiver, it nevertheless may be sufficiently strong to adversely affect the noise-blanker circuitry.

The noise blanker method and apparatus of the present invention prevents continuous-wave or continuous-wave-like signals from significantly interfering with noise-blanking operations. Such continuous-wave interfering signals heretofore prevented prior art noise blankers from optimally blanking out noise from received signals and, in some instances, prevented noise from being eliminated at all.

The noise blanker of the present invention exhibits improved performance over prior art noise blankers in this regard, by utilizing a gain control circuit which responds only to the average power in a noise blanking channel to control the channel gain so that CW-type signals are always held below the blanker threshold. In this fashion, the noise blanker is provided with a significant degree of immunity to capture by continuous-wave signals.

Noise blankers in the prior art have typically been disposed at the output of the transceiver's RF preselection circuitry. Advantageously, the noise blanker circuitry of the present invention is disposed to operate on the transceiver's intermediate frequency input signal. The intermediate frequency input signal is a converted frequency signal which is produced by mixing the RF input signal with the signal produced by a local oscillator in a mixer stage to obtain a signal having a frequency equal to the difference between the mixer input signals. In this fashion, the present noise blanker circuit operates on a sample of noise which is as close as possible to the receiver bandpass.

BRIEF DESCRIPTION OF THE DRAWINGS

These as well as other objects and advantages of the present invention will be better appreciated by reading the following detailed description of the presently preferred exemplary embodiment of the present invention taken in conjunction with the accompanying drawings of which.

DETAILED DESCRIPTION OF THE DRAWINGS

Figure 1:
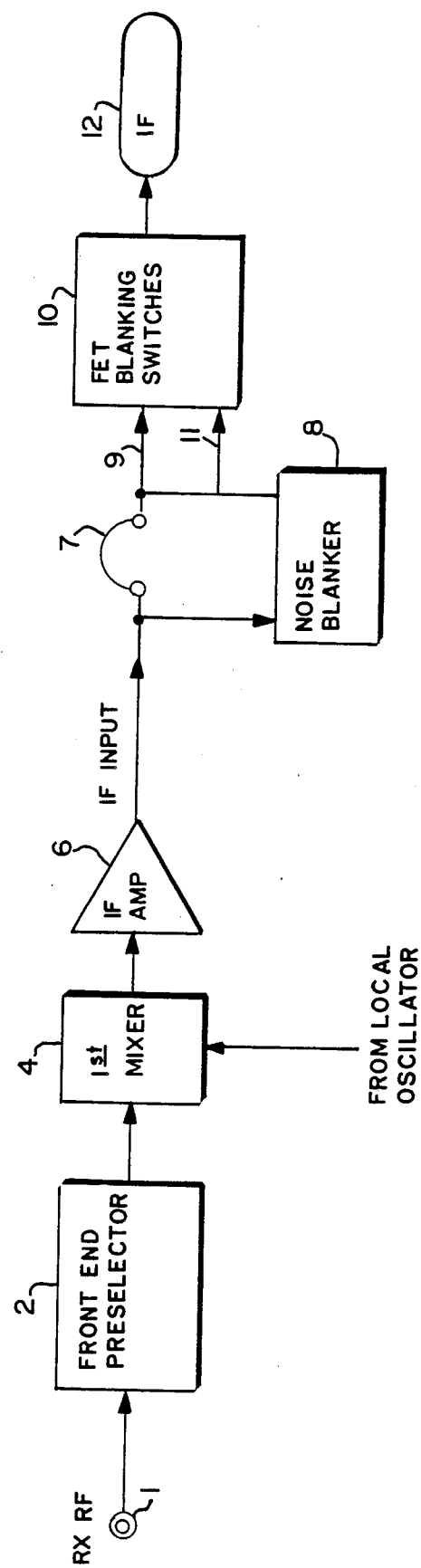
FIG. 1 is schematic block diagram which shows the disposition of the noise blanker in an exemplary radio receiver.

Turning first to FIG. 1, in the exemplary embodiment of the present invention, the noise blanker circuit 8 is implemented as a plug-in printed circuit board which plugs into a mobile or portable radio receiver board. With the noise blanker unit 8 in place, jumper wire 7 is removed.

The noise blanker 8 is designed to improve receiver performance by blanking out impulse noise emanating from the alternator, ignition system, and other sources as described above. As will be explained in detail below, this is accomplished by delaying an input IF signal for 200 nanoseconds while generating a blanking gate pulse occurring at the same time as the noise pulses. These blanking pulses are then used to turn off the delayed IF signal precisely where the noise occurs, resulting in noise-free audio reception.

In the system shown in FIG. 1, a radio signal is received by antenna 1 and is coupled to front-end preselector 2. Front-end preselector 2 may be conventionally implemented and typically comprises a set of filters and associated circuitry which sets the sensitivity of the receiver to noise. Preselector 2 serves to filter unwanted signals to prevent such signals from being input to the first mixer in a manner which is well known in the art.

The mixer 4, as is conventional, multiplies the local oscillator frequency by the incoming signal to generate sum and difference signals. In the exemplary embodiment, the difference output frequency generated by first mixer 4 is a 20.8 MHz intermediate-frequency signal. The output of mixer 4 is amplified by intermediate-frequency amplifier 6 which is tuned to amplify signals in the frequency range of 20.8 MHz.

As indicated above, heretofore noise blankers have typically received radio frequency input signals directly from the receiving antenna. In contrast, the noise blanker 8 of the present invention receives the amplified intermediate frequency signal output of the first mixer 4. In a manner which will be explained in detail below, the output of noise blanker 8 is coupled to FET blanking switches 10.

The noise blanker 8, which has reduced vulnerability to capture by CW signals, operates to improve receiver performance by blanking out impulse noise. This is accomplished by delaying the intermediate frequency signal applied via line 9 to the FET blanking switches 10. Additionally, blanking gate pulses occurring at the same time as the noise pulses are applied via control line 11 to FET blanking switches 10. Blanking pulses are then used to turn off the delayed IF signal precisely where the noise occurs, resulting in noise free audio reception.

The intermediate-frequency signals output from FET blanking switches 10 are then coupled to the IF processing subsystem 12 of the radio where the signal is further filtered and amplified. The filtered and amplified signal is then applied to a second mixer where it is further down-converted to form a second IF-frequency signal. Thereafter, the signal of interest is ultimately detected via a conventional quadrature detector. The IF-processing subsystem is conventional and forms no part of the present invention.

Figure 2:
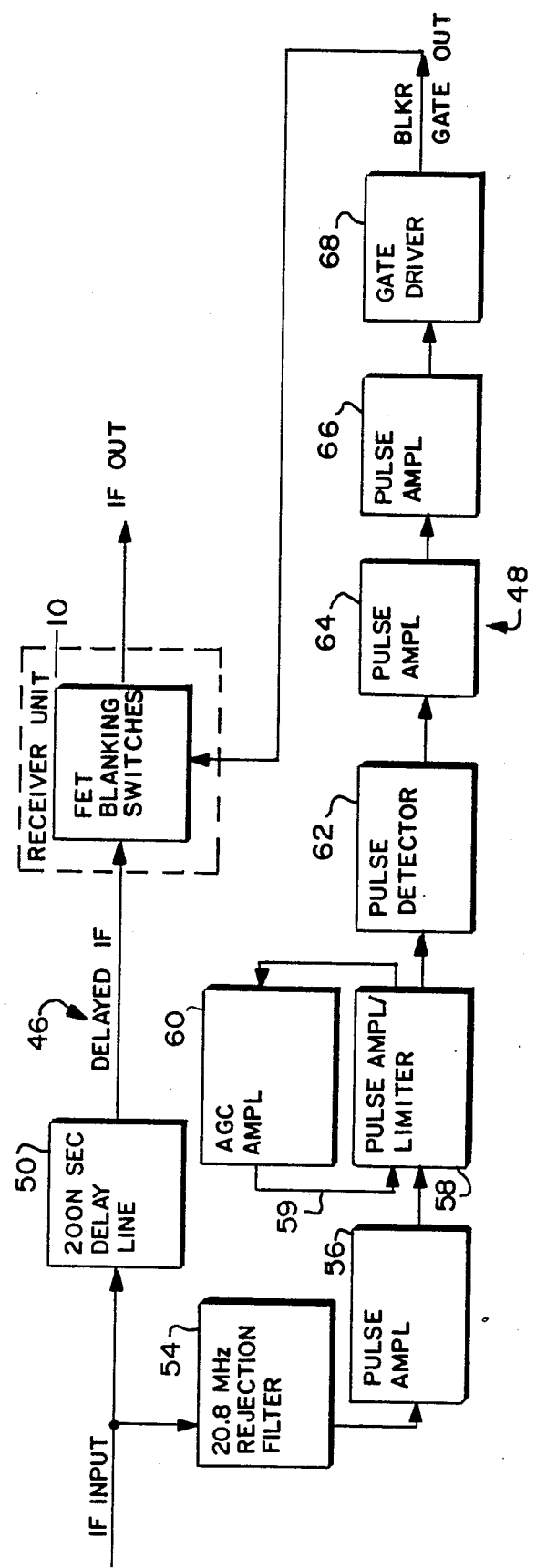
FIG. 2 is a block diagram of noise blanker apparatus in accordance with an exemplary embodiment of the present invention.

A block diagram of exemplary noise blanker circuitry is shown in FIG. 2. As indicated in FIG. 2, the input to the noise blanker circuitry is the IF input signal described above. The IF input signal is received in a top branch 46 of the noise blanker by a 200 nanosecond delay line 50. The delay line 50 serves to delay both the IF input signal and the associated noise for a time period sufficient for the bottom branch 48 of the noise blanker circuitry to detect a noise pulse and to transmit a blanking signal to the FET blanking switches 10. Thus, the delay introduced in the top branch 46 by delay line 50 must be of at least a duration for the signal transmitted via branch 48 to be operated on by the components therein. The 200 nanosecond delay introduced by delay line 50 allows sufficient time for the processing in branch 48. It is noted that the hole introduced into a conversation by the 200 nanosecond delay is not audible to a listener, even during relatively high noise levels.

Figure 4:
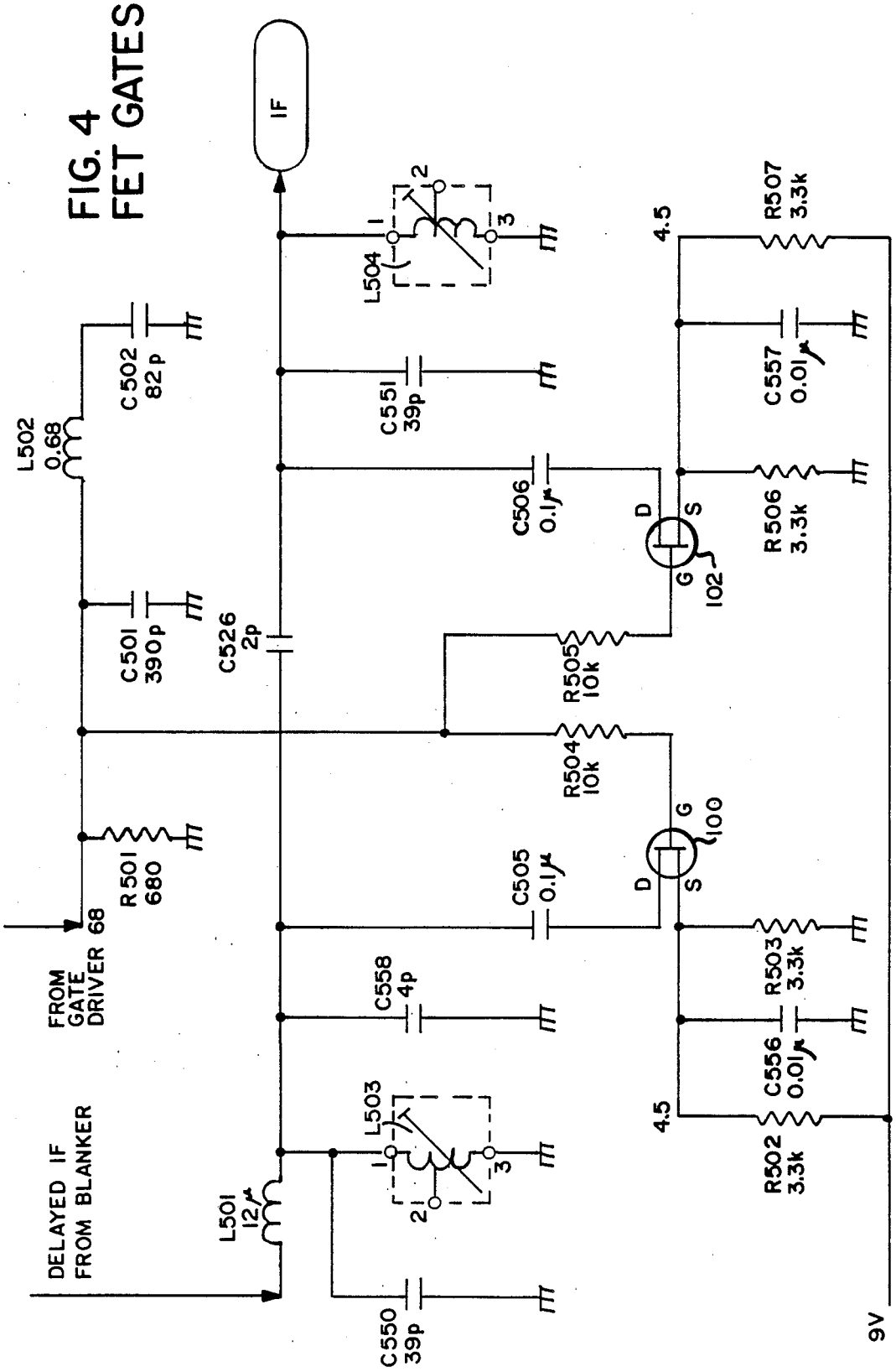
FIG. 4 is a schematic diagram of an exemplary implementation of the blanking switches shown in FIGS. 1 and 2.

The delayed IF signal on branch 46 is transmitted to FET blanking switches 10, which are described in detail in conjunction with FIG. 4. Blanking switches 10 which may, for example, be 2 FET switches, serve to short the noise signal to ground. Thus, the high-peak-power, narrow noise pulse is not transmitted to the IF processing circuitry, but rather is eliminated by grounding. After the high-impulse narrow noise pulse has been grounded, the FET switches 10 are opened to pass the IF signal for further IF processing.

Focussing on bottom branch 48 of the noise blanker circuit, the IF input (in addition to being transmitted to delay line 50 in branch 46) is coupled to rejection filter 54. Turning back to FIG. 1, the output of IF amplifier 6 comprises signals which are at the IF frequency due to the operation of mixer 4. The information of interest is selected from the totality of signals present in the IF input by filtering circuitry present in, for example, IF processing circuitry 12. Signals of frequencies which are spread around the IF frequency may also be present in the IF input to noise blanker 8 shown in FIG. 1.

If all of the IF and other frequency signals are input to pulse amplifier/limiter 58 shown in FIG. 2, mixing products will be produced, one of which will be at the IF frequency. If such a mixing product gets back on to the IF signal path, then such a signal will create interference with the signals to which the receiver is intended to listen.

In the absence of the 20.8 MHz rejection filter 54 and the AGC Amplifier 60, the radio performance with regard to spurious signal rejection and intermodulation distortion (IM) would be poor. The rejection filter 54 improves the spurious signal rejection and the intermodulation distortion (IM) as normally measured (i.e., with two signals close to the desired signal, one and two-channel separation., respectively). However, these latter signals are only two sets of the very many other signals that cause problems.

The mechanism by which these other signals cause problems is related to the non-linear operation in pulse amplifier 58 when driven by high-level signals, such as those used in IM measurments. Pulse amplifier 58 as controlled by AGC amplifier 60 operates such that the gain of pulse amplifier 58 is controlled by AGC 60 to keep the amplifier 58 out of saturation. The AGC circuit 60 becomes effective at the start of the non-linear region to keep amplifier 58 out of saturation, by progressively reducing the amplifier gain as signals increase above this threshold. The addition of the AGC circuit 60 also relaxes the requirements of the rejection filter 54, in suppressing the response to spurious signals, by maintaining linear operation of the pulse amplifier 58. In this fashion, by keeping the pulse amplifier 58 out of saturation, the undesirable mixing components are kept to a very low level.

These mixing products are, however, not removed entirely. Even with AGC 60 there is still some component at the 20.8 MHz IF frequency. This is further attenuated by the rejection filter 54 as the signal passes in the reverse direction to the IF input. The rejection filter 54 serves to eliminate such low level mixing products at the IF frequency which serve to prevent the undesirable mixing products from getting out of the noise blanker circuitry and back on to the IF processing path.

It is noted that in the exemplary embodiment the IF frequency is 20.8 MHz. This intermediate frequency, if passed to bottom branch 48 would serve, like continuous wave signals, to interfere with the operation of the noise blanker. Accordingly, a 20.8 MHz rejection filter is placed in front of the detection circuitry of branch 48 in order to eliminate the interfering intermediate frequency signal. Rejection filter 54 may be a conventional rejection filter which serves to ground 20.8 MHz signals while passing other signals applied to its input.

The function of noise blanker branch 48 is to detect noise pulses by detecting the leading edge of any narrow pulse which is received at the front end of the receiver and is reflected in the IF-input signal. At the same time, branch 48, by virtue of the operation of AGC amplifier 60 to be described in detail below, reduces the noise blanker's vulnerability to interference or capture by continuous-wave signals.

The output of rejection filter 54 is amplified by pulse amplifier 56. Pulse amplifier 56 is a conventional pulse amplifier and may, for example, be an FET transistor type 3N201.

The output of pulse amplifier 56 is further amplified in pulse amplifier/limiter 58. Additionally, circuitry associated with block 58 serves to limit the amplitude of any input noise pulse to prevent it from degrading the performance of any system component. The limiter in component 58 serves to modify the shape of the received noise pulse to more closely resemble a square wave pulse.

The automatic gain control amplifier 60 is coupled to the output of pulse amplifier/limiter 58 and responds to the average value of the pulse amplifier's output. As the amplitude of the signal out of pulse amplifier 58 increases beyond a predetermined threshold, the automatic gain control 60 serves to reduce the gain of the amplifier 58. Without AGC 60, an interfering continuous wave signal would be passed to pulse detector 62 and would serve to mask the noise pulse.

The pulse amplifier/limiter 58 has its gain modified as a function of the voltage applied by AGC amplifier 60 via line 59. In this regard, the AGC 60 monitors the output of pulse amplifier/limiter 58 and upon detecting that the pulse amplifier's voltage output is above a predetermined threshold, increases the voltage on line 59 to thereby decrease the pulse amplifier gain. In this fashion, the output of pulse amplifier 58 is held at a constant value, once a predetermined threshold is reached.

It is noted that a noise pulse is very narrow and occurs typically less than 1000 times per second. Accordingly, noise pulses have a very small average power value. In this regard, such noise pulses occur in very short bursts 10 to 20 nanoseconds in extent spaced relatively far apart, e.g., less than a 1000 times per second. This means that the average power is $20 \times 10^{-31.9}$ (typical pulse width)$\times 1000$ or $2 \times 10^{-5}$ or 47 dB below the peak power.

Accordingly, noise pulses do not significantly affect the amount of gain control applied by AGC 60 which responds to the average power in the blanker channel 48. A continuous-wave signal, however, has a significant average power.

The AGC 60 responds to the average value output of pulse amplifier/limiter 58 since it reacts slowly and does not respond to narrow, high-impulse noise pulses. On the other hand, continuous signals, such as a CW-like signal, will initiate a controlled response from AGC 60.

Figure 3:
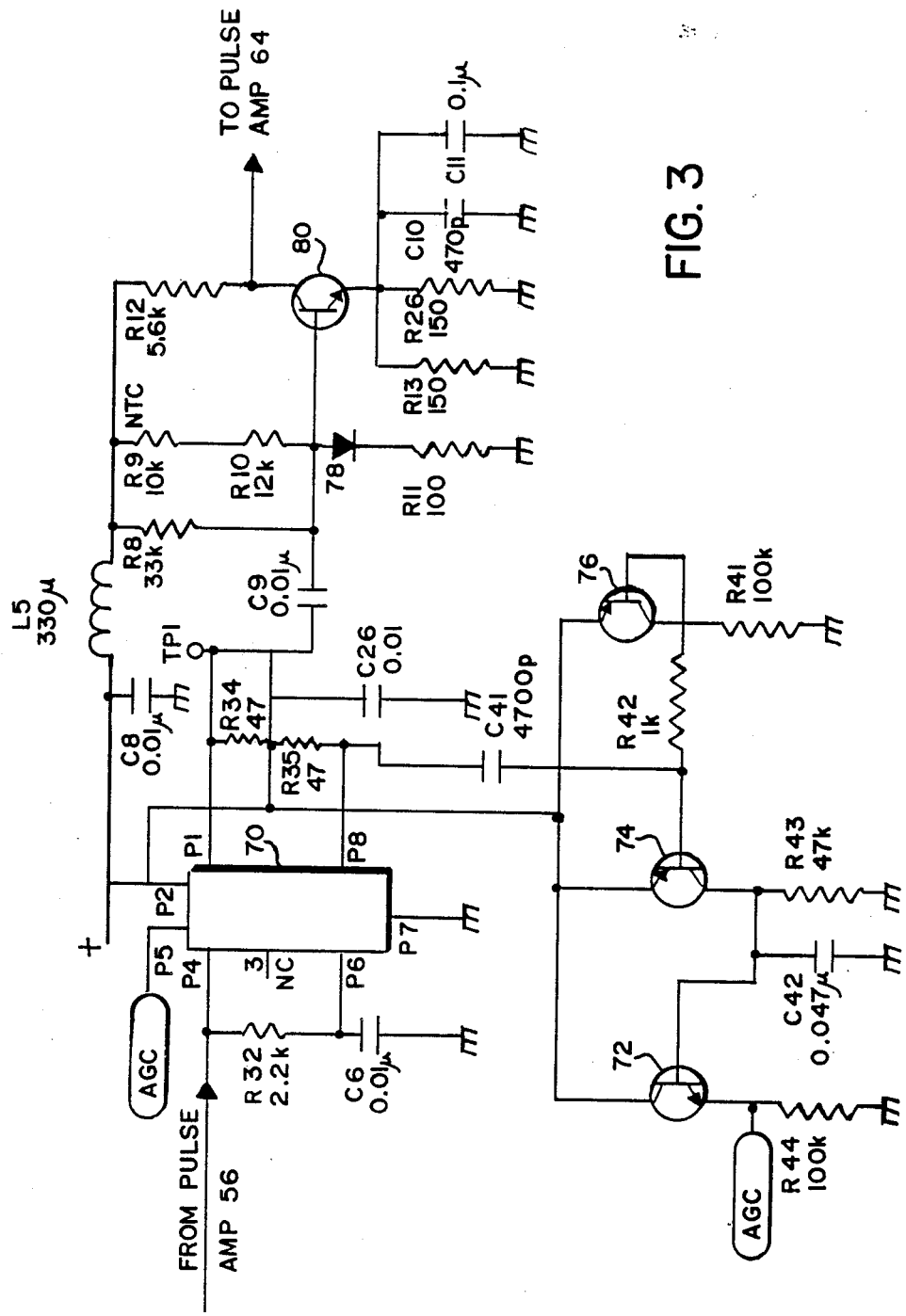
FIG. 3 is a schematic circuit diagram of an exemplary pulse amplifier/limiter, AGC amplifier and pulse detector shown in FIG. 2.

The AGC circuit 60, which is shown in detail in FIG. 3, is tailored to reject continuous wave signal interference as much as possible. The AGC 60 provides a gain control circuit which responds only to the average power in the blanker channel 48 to control the channel gain so that CW-type signals are always held below the blanker threshold. With respect to the blanker threshold, it is noted that pulses which are below the blanker threshold do not create interference which will disturb a conversation. The pulse detector 62 is set to trigger blanking at a point where noise signals are at an amplitude where a conversation will be disturbed.

In the absence of any noise signal at the output of pulse amplifier 56, AGC 60 serves to drive pulse amplifier/limiter 58 to its full gain setting. As noted above, high-peak-value signals at the output of pulse amplifier 56 which are narrow and have low average power, don't affect the operation of AGC 60. Thus, typically at the onset of blanking, AGC 60 does not operate to modify the gain of pulse amplifier/limiter 58. However, once the average value of the output of pulse amplifier/limiter 58 begins to increase, the AGC 60 begins to reduce the gain amplifier/limiter 58 so as to permit CW-type signals to be held below the blanking threshold.

The output of pulse amplifier/limiter 58 is coupled to pulse detector 62 which serves to detect sharp edges of signals received from amplifier limiter 58. Thus, pulse detector 62 acts as a differentiating circuit that looks for a rapid change over time of signals input thereto. The pulse detector 62 is designed to detect pulses having a rise time on the order of 10 microseconds or faster. The pulse detector 62 serves to provide a precise definition of the leading edge of a noise pulse by providing a narrow output identifying the leading edge of the noise pulse.

The pulse amplifiers 64 and 66 serve to amplify the output of pulse detector 62 so as to turn on gate driver 68. Upon being triggered by the amplified pulse from pulse amplifier 66, gate driver 68 turns on the FET blanking switches 10. Gate driver 68 is a power amplifier which generates enough power to rapidly turn on the FET blanking switches 10.

The delayed IF signal from delay line 50 arrives at the blanking switches 10 at the same time as the gating pulses from gate driver 68. The gating pulses switch the FET blanking switches 10 to an on-state in coincidence with the noise pulses in the IF signal, shunting all noise pulses to ground.

FIG. 3 is a schematic diagram of an exemplary pulse amplifier/limiter 58, AGC amplifier 60 and pulse detector 62 shown in FIG. 2. Although specific component values are shown in FIG. 3 (and 4), these component values are exemplary only and should not be construed as limiting in any respect.

FIG. 3 shows an AGC-controlled amplifier 70 (which corresponds to the amplifier portion of component 58 shown in FIG. 2). Amplifier 70 may be a conventional wideband amplifier Model No. MC1490P.

Amplifier 70 receives the output signal from pulse amplifier 56 (shown in FIG. 2) as its input signal. Amplifier 70 amplifies the difference between the voltages applied to its input pins P4 and P6. The voltage difference between pins P4 and P6 is determined by the voltage across resistor R32 which voltage is determined by the signal from pulse amplifier 56. Resistor R32 is coupled to ground via capacitor C6. Pins P3 and P7 of amplifier 70 are ground pins.

Outputs from amplifier 70 are generated at both pins P1 and P8. The amount by which the voltage difference between pins P4 and P6 is amplified by amplifier 70 is controlled by the voltage applied to pin P5 (via an exemplary circuit corresponding to AGC 60 of FIG. 2). The voltage applied to pin P5 is the voltage at the emitter of transistor 72 (as indicated in FIG. 3 by the AGC symbol both at the emitter of transistor 72 and at pin P5).

The output of amplifier 70 on pin P8 is coupled to the base of transistor 74 via capacitor C41. Capacitor C41 in conjunction with the parallel combination of resistor R43 and capacitor C42 (which are coupled to the collector of transistor 74, to the base of transistor 72 and to ground) serve to generate a signal representing the average of the output signal generated on pin P8. The average output signal is amplified by transistors 74 and 72. The output at the emitter of transistor 72 is fed back to pin P5 of amplifier to create the AGC control voltage. Resistor R44 is coupled to the emitter of transistor 72 and to ground and serves as a pull-down resistor for transistor 72 in its emitter-follower configuration as will be appreciated by those skilled in the art.

The automatic gain control circuit in FIG. 3 also includes transistor 76 which provides a voltage reference that properly biases transistor 74. The voltage reference applied by transistor 76 tracks the DC offset voltage of amplifier 70 which may be due, for example, to temperature variations. The base of transistor 76 is coupled to its collector which is coupled to ground via resistor R41. The collector and base of transistor 76 are coupled to the base of transistor 74 via resistor R42. Resistors R41 and R42 also serve to generate the reference voltage for transistor 74.

Power is coupled to the AGC circuit shown in FIG. 3 via the emitter of transistors 74 and 76 and the collector of transistor 72. Power is supplied to amplifier 70 via pin P2.

The output from pulse amplifier 70 is coupled to a pulse detector to be described below via output pin P1. Coupled to the outputs P1 and P8 of pulse amplifier 70 are load resistors R34 and R35, respectively, which are in turn coupled to ground via capacitor C26 (which couples AC signals to ground). The AC ground formed by capacitor C26 is also coupled to the power line feeding the AGC circuit and pin P2 of pulse amplifier 70.

With respect to the noise-pulse-limiting circuitry referred to above, the output of amplifier 70 from pin P1 is coupled via capacitor C9 to a diode 78 which is coupled to ground via resistor R11. Any positive going signal from pin P1 of amplifier 70 is clamped by diode 78 and resistor R11. Thus, diode 78 and resistor R11 serve to perform the previously-described limiting function by limiting the positive excursions of output pulses from pin P1 of amplifier 70.

Diode 78 and resistor R11 also form part of the threshold-detection circuitry of the pulse detector 62 shown in FIG. 2. In this regard, the threshold detector shown in FIG. 3 includes capacitors C9 through C11, transistor 80 in conjunction with resistors R8, R9, R11, R12, R13, R26, and diode 78. Bias voltage is supplied to the threshold-detection circuitry via the LC circuit formed by capacitor C8 which is coupled to ground and to inductor L5.

The output pulse from amplifier 70 is coupled to the base of transistor 80 via AC coupling capacitor C9. Transistor 80 conducts and generates an output pulse which is then coupled to pulse amplifier 64 shown in FIG. 2.

It is noted that resistor R9 is a negative temperature compensating resistor whose temperature characteristic is chosen to complement amplifier 70 so that transistor 80 is biassed at the threshold of conduction by R8, R9, RIO, R11 and diode 78 as the temperature changes.

Resistor R12, which is coupled to the collector of transistor 80 and resistors R13 and R26, which are coupled to the emitter of transistor 80, control the DC gain of the pulse detector stage. Capacitors C10 and C11 coupled in parallel to the emitter of transistor 18 are AC bypass capacitors which enhance the response of the pulse detector circuitry to fast changing signals. The detected pulse at the collector of transistor 80, as indicated above with respect to FIG. 2, is coupled to succeeding pulse amplifying stages 64 and 66 and to the blanking switches 10 via gate driver 68.

An exemplary configuration of the FET blanking switches 10 shown in FIGS. 1 and 2 is shown in detail in FIG. 4. The function of the FET noise blanking switches 10 is to provide at least 55 dB of attenuation on command from the noise blanker described in conjunction with FIGS. 1-3. The command signal generated by the noise blanker is the output of gate driver 68. The output signal from gate driver 68 is shown as an input signal in FIG. 4.

In response to the rising edge of the output of gate driver 68, the voltage which is applied to the gates of FET's 100 and 102 via current limiting resistors 504 and 505, respectively, also rises thereby causing the impedance of the source-drain path of FET's 100 and 102 to drop.

The input signal from gate driver 68 is shaped by inductor L502 and capacitors C501 and C502 to minimize interference between the gating signal and the delayed IF signal. Resistor R501 is coupled to capacitor C501 and inductor L502 and serves as a load resistor. The voltage rise at the gates of FET's 100 and 102 triggers the FET's into a fully conductive state. The conduction of FET's 100 and 102 causes the delayed IF signal from the noise blanker to be coupled to ground to appropriately attenuate the IF signal upon the detection of a noise pulse.

Focussing on FIG. 4 in more detail, a delayed IF signal from the noise blanker is coupled to inductor L501. The signal from inductor L501 is coupled to the drains of FET's 100 and 102 via coupling capacitors C505 and C506, respectively. When blanking is to occur, as indicated by the control signal from gate driver 68, the gate signals on FET's 101 and 102 go high and the source to drain impedance of both FET's goes low. Additionally, during this time period the filters L503/L550/L558 and L504 are detuned. At the same time, a low impedance path via capacitors C556, C557 is provided for RF to ground to effectively chop a hole in the information plus noise signal.

Capacitor C550, inductors L503 and L504 and capacitors C558 and C551 each of which is coupled (either directly or via capacitor C526) to inductor L501 (which is in turn coupled to the delayed IF signal from the noise blanker) form tuned circuits that create a high impedance at the output side of inductor L501.

Focussing on the source circuits of FET's 100 and 102, these circuits are biased by a 9 volt bias voltage. Resistor R502 is coupled to the bias voltage and in combination with resistor R503 forms a voltage divider to bias the source voltage of FET 100 at 4.5 volts. Similarly, resistors R507 and R506 form a voltage divider to similarly bias the source of FET 102 at 4.5 volts. When the voltage at the gates of FET's 100 and 102 exceeds 4.5 volts, the respective FET's are turned on. Capacitors C556 and C557 provide a low impedance AC path to ground for FET's 100 and 102. In this fashion, capacitors 556 and 557 serve to ground the impulse noise pulse applied to the FET blanking switches of FIG. 4.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a communications device, noise blanker apparatus for reducing interference due to noise present in information signals having frequencies within a predetermined frequency range comprising:
   first means for delaying an information signal for a predetermined period of time;
   second means coupled to receive said information signal for detecting the presence of noise pulses in said information signal, said second means including means for compensating for interference due to continuous wave signals outside said predetermined frequency range; and
   noise blanking means responsive to said first means and said second means for eliminating noise from said information signal.

2. Noise blanker apparatus according to claim 1, wherein said communications device includes mixing means for generating an intermediate frequency information signal, and wherein said first and second means are coupled to receive said intermediate frequency information signal.

3. Noise blanker apparatus according to claim 1, wherein said first means for delaying operates to delay the information signal for a time period sufficient for said information signal to be processed by said second means.

4. Noise blanker apparatus according to claim 2, wherein said second means includes filter means for rejecting signals having a frequency on the order of said intermediate frequency.

5. Noise blanker apparatus according to claim 1, wherein said second means includes means for amplifying a signal applied thereto, and wherein said means for compensating includes automatic gain control means for controlling the gain of said means for amplifying so as to reduce the vulnerability of the noise blanker apparatus to degraded performance due to interference from continuous wave signals.

6. Noise blanker apparatus according to claim 5, wherein said automatic gain control means includes means for adjusting the gain of said means for amplifying to maintain the output of said means for amplifying at a predetermined level.

7. Noise blanker apparatus according to claim 6, wherein said automatic gain control includes means detecting when the output of said means for amplifying reaches said predetermined level and for thereafter reducing the gain of said means for amplifying to maintain the output of said means for amplifying at said predetermined level.

8. Noise blanker apparatus according to claim 1, wherein said means for compensating includes means for determining the average value of a noise related signal.

9. Noise blanker apparatus according to claim 1, wherein said second means includes means, coupled to said means for compensating, for detecting noise pulses; and
   driver means, coupled to said means for detecting and responsive to the detection of a noise pulse, for generating a noise blanker control signal;
   said noise blanking means including means responsive to said noise blanker control signal for eliminating noise from said information signal.

10. Noise blanker apparatus according to claim 1, wherein said second means includes means for limiting the amplitude of noise pulses applied thereto,
    and wherein said second means includes means responsive to said means for limiting to generate a signal indicative of a noise pulse.

11. Noise blanker apparatus according to claim 1, wherein said noise blanking means includes first and second noise blanking switch means, said first and second noise blanking switch means including means responsive to a control signal from said second means for grounding noise signals coupled thereto from said first means.

12. In a communication device, noise blanker apparatus for reducing interference due to noise present in an information signal having a predetermined frequency comprising:
    processing means for receiving said information signal and for generating an output signal compensated for interference, said processing means includes a filter, coupled to receive said information signal, which rejects signals having a frequency on the order of said predetermined frequency and passes a filtered signal, means for amplifying said filtered signal and for generating said compensated signal, and an automatic gain control circuit for controlling the gain of said means for amplifying to maintain substantially linear operation of said means for amplifying;
    noise detection means responsive to said compensated signal for detecting the presence of noise pulses associated with said information signal; and
    means responsive to said noise detection means for eliminating noise in said information signal.

13. Noise blanking apparatus according to claim 12, further including delay means for delaying said information signal a predetermined period of time; and
    wherein said means for eliminating is coupled to said delay means and to said noise detection means.

14. Noise blanker apparatus according to claim 12, wherein said communications device includes mixing means for generating an intermediate frequency information signal, and wherein said processing means is coupled to receive said intermediate frequency information signal.

15. Noise blanker apparatus according to claim 14, wherein said filter rejects signals having a frequency on the order of said intermediate frequency.

16. Noise blanker apparatus according to claim 12, wherein said processing means includes means for determining the average value of a noise indicating signal.

* * * * *